(12) United States Patent
Mudusuru et al.

(10) Patent No.: US 9,703,346 B2
(45) Date of Patent: Jul. 11, 2017

(54) FIRMWARE INTERFACE WITH BACKUP NON-VOLATILE MEMORY STORAGE

(71) Applicant: Intel Corporation, Santa Clara, CA (US)

(72) Inventors: Giri P. Mudusuru, Portland, OR (US); Vincent J. Zimmer, Federal Way, WA (US); Karunakara Kotary, Portland, OR (US); Ronald N. Story, Hillsboro, OR (US); Robert C. Swanson, Olympia, WA (US); Isaac W. Oram, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 242 days.

(21) Appl. No.: 14/312,017

(22) Filed: Jun. 23, 2014

(65) Prior Publication Data

US 2015/0370302 A1  Dec. 24, 2015

(51) Int. Cl.
*G06F 1/30* (2006.01)
*G06F 11/14* (2006.01)
(Continued)

(52) U.S. Cl.
CPC .............. *G06F 1/30* (2013.01); *G06F 11/1441* (2013.01); *G06F 12/0246* (2013.01);
(Continued)

(58) Field of Classification Search
CPC ...................................... G06F 1/26; G06F 1/30
(Continued)

(56) References Cited

U.S. PATENT DOCUMENTS 6,195,754 B1 * 2/2001 Jardine ..................... G06F 1/30
                                                               713/324
6,848,046 B2    1/2005 Zimmer
(Continued)

FOREIGN PATENT DOCUMENTS

WO      2014042870      3/2014

OTHER PUBLICATIONS

Nystrom, Magnus, et al., "UEFI Networking and Pre-OS Security," Intel Technology Journal, 2011, pp. 80-101, vol. 15, Issue 1, Intel.
(Continued)

*Primary Examiner* — Chun Cao
(74) *Attorney, Agent, or Firm* — Grossman, Tucker, Perreault & Pfleger, PLLC.

(57) ABSTRACT

Generally, this disclosure provides systems, devices, methods and computer readable media for a Unified Extensible Firmware Interface (UEFI) with durable storage to provide memory write persistence, for example, in the event of power loss. The system may include a processor to host the firmware interface which may be configured to control access to system variables in a protected region of a volatile memory. The system may also include a power management circuit to provide power to the processor and further to provide a power loss indicator to the firmware interface. The system may also include a reserve energy storage module to provide power to the processor in response to the power loss indicator. The firmware interface is further configured to copy the system variables from the volatile memory to a non-volatile memory in response to the power loss indicator.

26 Claims, 6 Drawing Sheets

(51) Int. Cl.
*G06F 13/32* (2006.01)
*G06F 12/02* (2006.01)
*G11C 5/14* (2006.01)
*G06F 11/20* (2006.01)

(52) U.S. Cl.
CPC .............. *G06F 13/32* (2013.01); *G11C 5/141* (2013.01); *G06F 11/2015* (2013.01)

(58) Field of Classification Search
USPC .................................. 713/300; 714/6.32, 14
See application file for complete search history.

(56) References Cited

U.S. PATENT DOCUMENTS

| | | | | |
|---|---|---|---|---|
| 8,289,801 B2* | 10/2012 | Smith | .................... | G11O 5/141 365/228 |
| 8,316,244 B1* | 11/2012 | Tupy | ........................ | G06F 1/30 713/300 |
| 8,677,097 B1* | 3/2014 | Nemazie | ............... | G06F 9/4411 711/103 |
| 9,081,734 B2* | 7/2015 | Soderlund | ........... | G06F 11/1417 |
| 9,158,700 B2* | 10/2015 | Goss | .................... | G06F 12/0804 |
| 2005/0193259 A1 | 9/2005 | Martinez et al. | | |
| 2006/0136765 A1* | 6/2006 | Poisner | ............... | G06F 11/1441 713/323 |
| 2007/0033322 A1 | 2/2007 | Zimmer et al. | | |
| 2014/0082406 A1* | 3/2014 | Erez | .................... | G06F 11/1441 714/2 |

OTHER PUBLICATIONS

International Search Report and Written Opinion in related application PCT/US2015/030700 mailed Jul. 23, 2015.

[nternational Preliminary Report on Patentability and Written Opinion issued in PCT Application No. Ct/US2015/030700, dated Jan. 5, 2017, 10 pp.

* cited by examiner

FIRMWARE INTERFACE WITH BACKUP NON-VOLATILE MEMORY STORAGE

FIELD

The present disclosure relates to a firmware interface, and more particularly, to a Unified Extensible Firmware Interface (UEFI) with durable storage to provide memory write persistence, for example, in the event of power loss.

BACKGROUND

A firmware interface generally provides an interface between an operating system (OS) and the underlying firmware and/or hardware associated with the system platform. Examples of firmware interfaces include the legacy Basic Input Output System (BIOS) and the more recent Unified Extensible Firmware Interface (UEFI). The firmware interface typically provides system boot services as well as runtime services. The runtime services provided by UEFI include management of access to system variables by the OS or other entities. The UEFI is generally required to guarantee that any updates that are made to these variables are durable, for example, that the updates will persist in the event of an unexpected power loss, reset or other interruption.

A potentially conflicting goal for the UEFI, however, is that these system variables be stored in a trusted and secure memory region or device that is not directly accessible by any entity other than the UEFI. For example, an OS that is compromised should not be able to access this UEFI reserved memory. Additionally, access to these variables by the OS may cause memory contention problems if they are concurrent with UEFI access. Unfortunately, memory that may be available for such a secure or isolated operating mode is typically volatile, such as, for example, dynamic random access memory (DRAM), the contents of which are lost in the event of power interruption.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

Generally, this disclosure provides systems, devices, methods and computer readable media for a Unified Extensible Firmware Interface (UEFI) with durable storage to provide memory write persistence, for example, in the event of power loss. A system, such as, for example, a computing or communications platform, may include one or more processors or cores and one or more memory modules, including both volatile and non-volatile memory types. The processors and memory may be configured to host (e.g., store and/or execute) the UEFI along with one or more operating systems (OSs) and other software applications or entities. The UEFI may be configured to perform system boot services and runtime (e.g., post-boot) services. The runtime services may include controlling access, by the OS, to system variables that are stored in a protected/secure region of the volatile memory.

The system may also include a power management circuit to provide power to the processor from one or more primary power sources. The system may also include a reserve energy storage module to provide power to the processor in the event of power loss from the primary power sources, in which case a power loss indicator may be provided to the UEFI. The UEFI may be further configured to copy the system variables from the volatile memory to a non-volatile memory in response to the power loss indicator.

Although embodiments consistent with the present disclosure may be presented in the context of a UEFI, it will be appreciated that the principles discussed may be applied to any type of interface between an OS and the underlying hardware.

Figure 1:
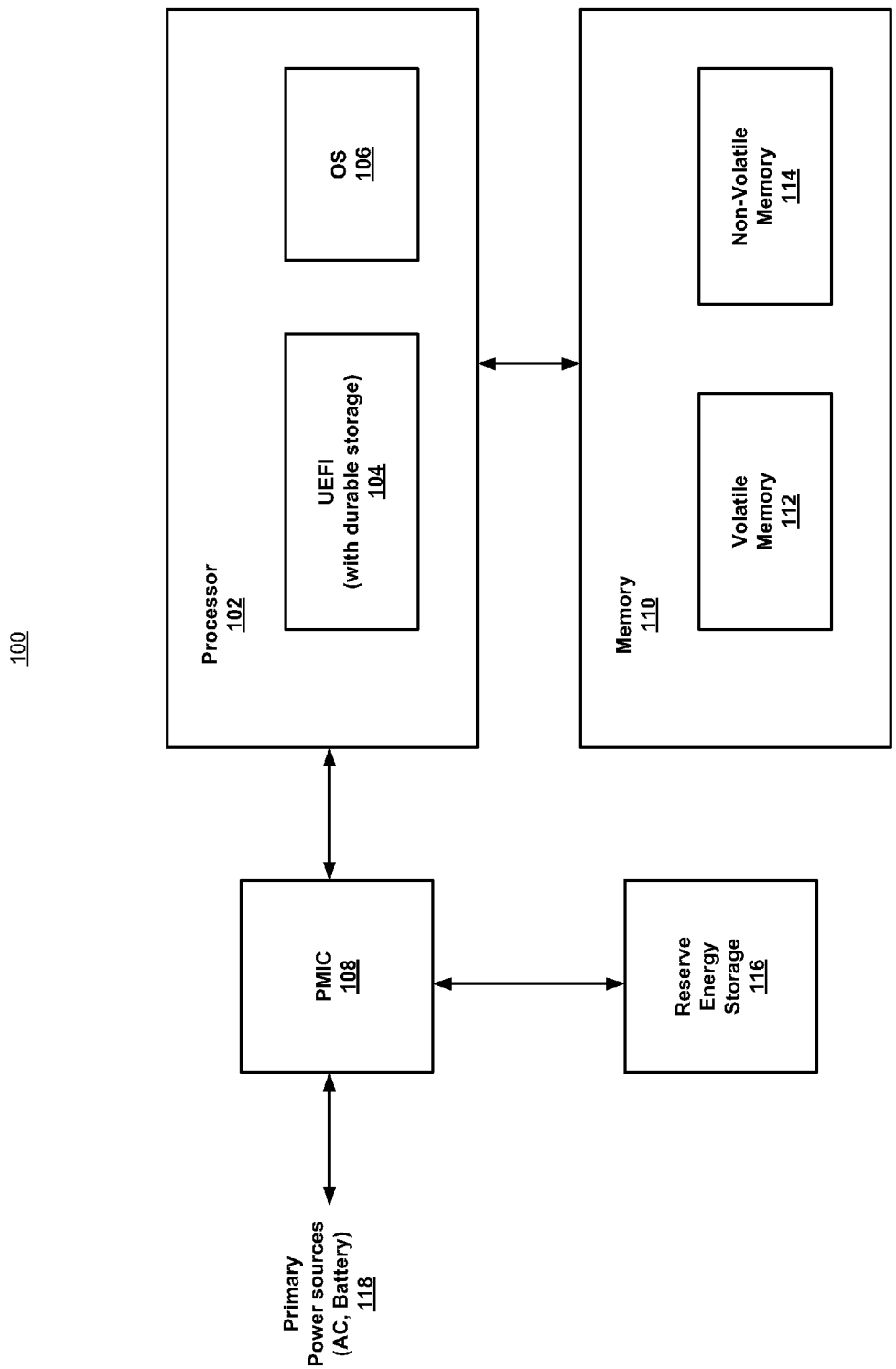
FIG. 1 illustrates a top level system diagram of one example embodiment consistent with the present disclosure.

FIG. 1 illustrates a top level system diagram 100 of one example embodiment consistent with the present disclosure. The system is shown to include a processor 102, memory module 110, a power management circuit 108 (also referred to as a power management integrated circuit or PMIC) and a reserve energy storage module 116. The memory module 110 includes volatile memory module 112 (e.g., memory that requires power to maintain data content) and non-volatile memory module 114. The processor 102 is shown to host UEFI 104 with durable storage capability, as will be explained in greater detail below. Durable storage may be understood to include memory storage configured to preserve data that has been written to it such that the data will persist even in the event of an unexpected power loss, reset or other interruption. The processor 102 is also shown to host OS 106.

In some embodiments, the system may be a computing device and/or communication device including, for example, a smart phone, smart tablet, personal digital assistant (PDA), mobile Internet device (MID), convertible tablet, notebook or laptop computer, workstation or desktop computer.

The PMIC 108 may be configured to provide power to the processor 102, and other system components, from one or more primary power sources 118 which may include an alternating current (AC) based power supply (e.g., mains or line power), a battery or any other suitable power source. In the event of power loss from the available primary power sources, the PMIC may switch over to the reserve energy storage module 116 to provide continuation of power to the system for a period of time sufficient to perform a "clean" shutdown, as will be described in greater detail below. Power loss may occur, for example, due to removal of a battery, disconnection of a power cord, excessive battery drain, etc.

Figure 2:
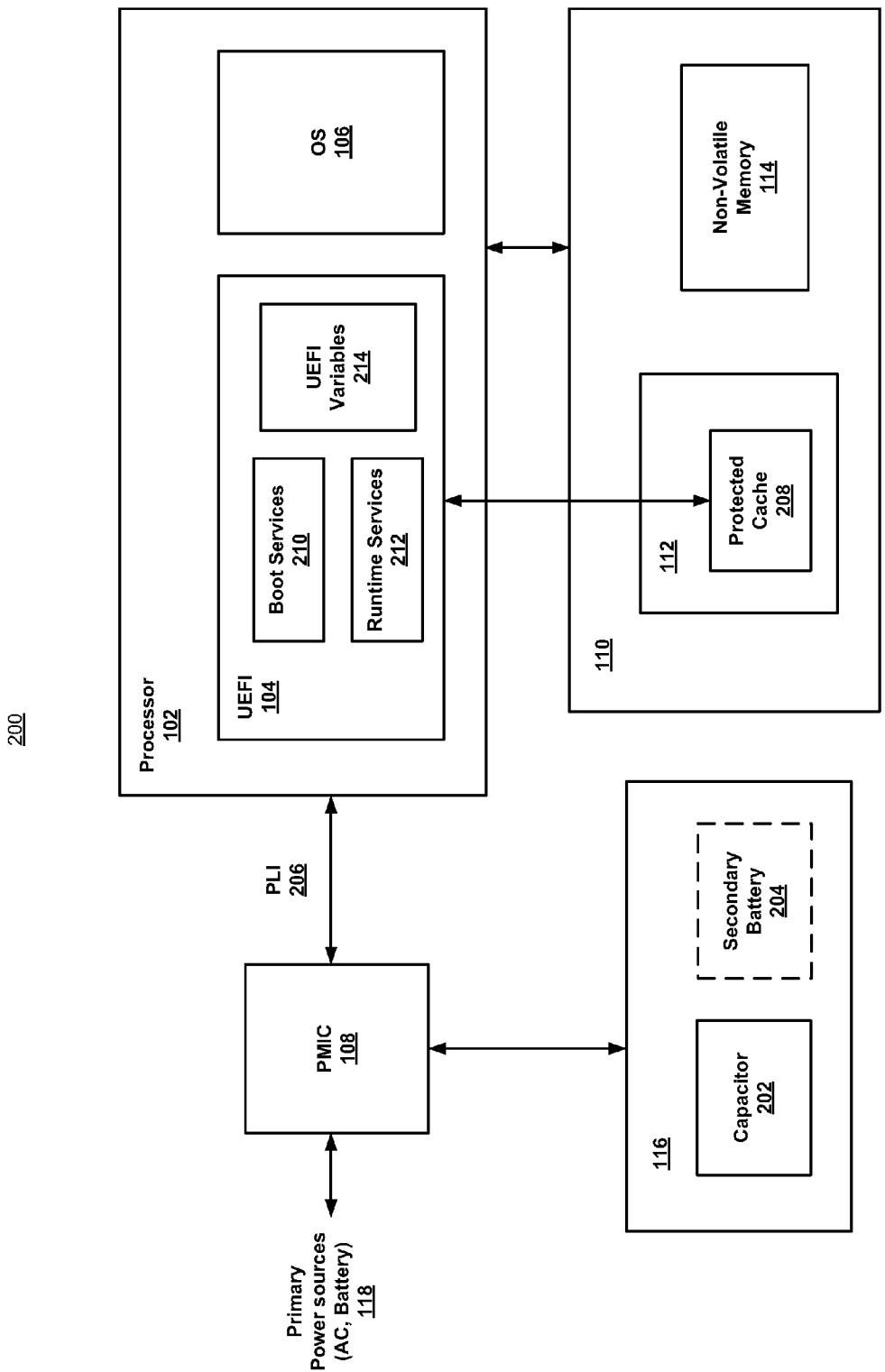
FIG. 2 illustrates a block diagram of an example embodiment consistent with the present disclosure.

FIG. 2 illustrates a block diagram 200 of an example embodiment consistent with the present disclosure. The UEFI 104 is shown in greater detail to include boot services module 210, runtime services module 212 and UEFI (or system) variables 214. The volatile memory module 112 is shown to include a protected cache region 208 that is not directly accessible by the OS 106. Non-volatile memory 114, in contrast, may be configured as shareable by both the UEFI 104 and the OS 106. The reserve energy storage module 116 is shown to include a capacitor 202 or optionally a secondary battery 204 or other power source suitable for at least temporary operation.

The UEFI 104 may be configured to provide boot services 210 that are associated with a system power up, reset or restart, during which the OS is generally not yet executing. The UEFI 104 may also be configured to provide runtime services 212 after the boot process completes and the OS has been initiated. During this time, when the OS is executing, sharing of memory between the UEFI and the OS may trigger memory contention problems and/or raise security issues. This is particularly true for sharing of memory regions that store UEFI authenticated variables including the Platform Key (PK), the Key Exchange Key (KEK), the data base of trusted keys, signatures and executable images (DB) and the database of non-trusted keys, signatures and executable images (DBX).

The runtime services 212 may enable indirect access to the UEFI variables 214 by the OS 106. This access may be provided through function calls such as, for example, GetVariable( ), for reading, and SetVariable( ), for writing, that are included in a programming interface between the UEFI 104 and the OS 106. In response to a read request, the UEFI may retrieve system variable data from the protected cache 208 of volatile memory 112. In response to a write request, the UEFI may store system variable data in the protected cache 208 of volatile memory 112. System variables may include, for example, the location of the boot loader, the system language preference, public keys for cryptography and the like, including the PK, KEK, DB and DBX previously described.

The UEFI firmware code, or at least the portion that implements these system variables, may be executed in a System Management Mode (SMM) of the processor with access to a protected System Management Random Access Memory (SMRAM). SMM and SMRAM are isolated from even the highest privilege level, Ring 0, under which the OS can execute. SMRAM is generally a volatile memory, however, the contents of which are lost during power interruption.

The PMIC 108 may be configured to maintain a charge on the capacitor 202 (or secondary battery 204) of the reserve energy storage module 116 while the primary power source 118 is available. The PMIC 108 may also be configured to detect a power loss from the primary power source 112 and switch over to the reserve energy storage module 116. In response to detecting this power loss, the PMIC 108 may also generate a power loss indicator (PLI) 206 to the processor 102 which may generate an interrupt, for example a System Management Interrupt (SMI), that triggers action by the UEFI 104 to perform a "clean" shutdown. The SMI forces the processor into a system management mode during which the UEFI runs in a trusted execution environment where the OS has relinquished control of the platform hardware. As part of a clean shutdown, the UEFI, running on remaining power from the reserve energy storage module 116, may be configured to copy system variables from the volatile protected cache memory 208 into a region of the non-volatile memory 114 (e.g., flushed from the cache) so that they will be preserved and available for a subsequent system reboot/restart after primary power is restored. After the system variables have been flushed from the cache, if sufficient reserve power is available, the clean shutdown may also include the generation of a non-maskable interrupt (NMI) by the UEFI to trigger the OS to perform any additional operations that may be appropriate, such as, for example saving the state and/or data of user applications.

In some embodiments, the UEFI 104 may be hosted on a second processor or microcontroller, with associated isolated memory cache for system variables, either or both of which may be separated or isolated from processor 102. This second processor/microcontroller may, however, be integrated into a system-on-a-chip (SoC) architecture that includes processor 102 and/or other components.

In some embodiments, the size of the capacitor 202 may be chosen to provide a discharge time constant of sufficient duration to allow for completion of the transfer of UEFI (system) variables from volatile to non-volatile memory. In some embodiments, the system variables may occupy approximately 128 kilobytes of memory, although smaller or larger sizes may also be implemented. In some embodiments, the volatile memory may be configured as Dynamic Random Access Memory (DRAM) and the non-volatile memory may be configured as Flash memory (e.g., NAND Flash memory).

Figure 3:
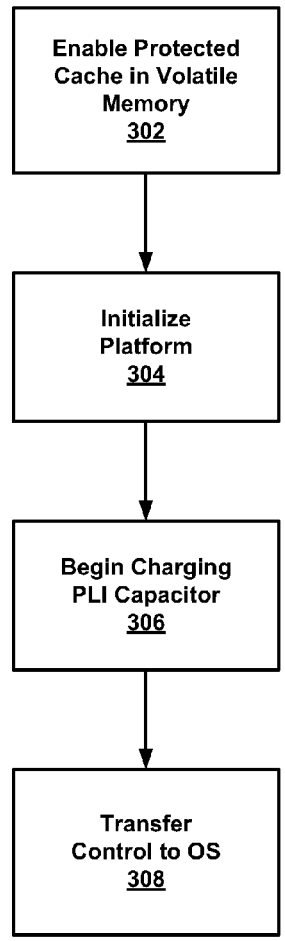
FIG. 3 illustrates a flowchart of operations of one example embodiment consistent with the present disclosure.

FIG. 3 illustrates a flowchart of operations 300 of one example embodiment consistent with the present disclosure. The operations may be performed by the UEFI during a system boot or reset. At operation 302, a protected cache is enabled in volatile memory. The protected cache may be configured to be inaccessible by the OS or any software/entities other than the UEFI. At operation 304, the UEFI initializes the platform. At operation 306, charging of the PLI capacitor (reserve energy storage module 116) begins. At operation 308, control is transferred to the OS.

Figure 4:
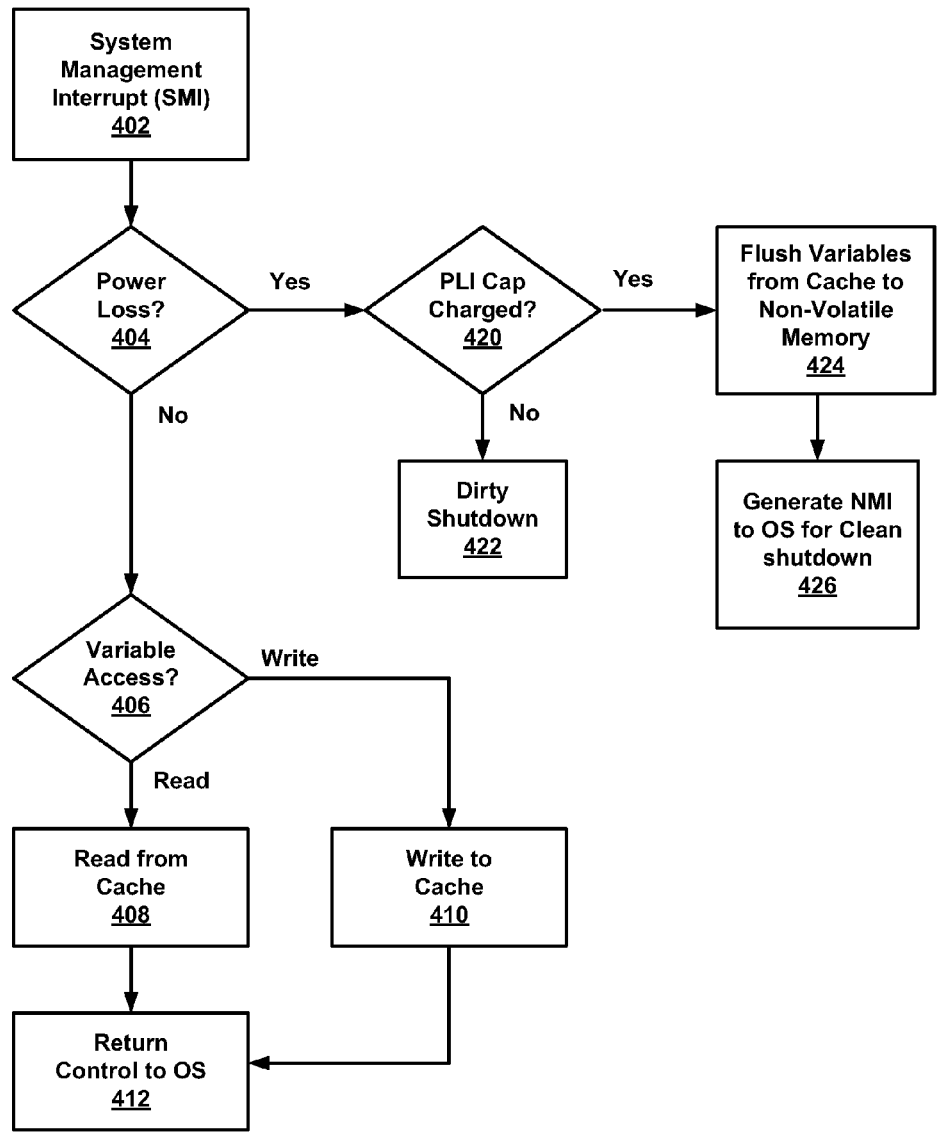
FIG. 4 illustrates a flowchart of operations of another example embodiment consistent with the present disclosure.

FIG. 4 illustrates a flowchart of operations 400 of another example embodiment consistent with the present disclosure. At operation 402, an SMI transfers control to the UEFI. At operation 404, the UEFI determines if a power loss indicator has been generated. If there is not a power loss indicator, then the UEFI determines, at operation 406, if a system variable access request has been made, for example through a GetVariable( ) or SetVariable( ) function call by the OS. If a write is requested, the data is written to the protected cache at operation 410. If a read was requested, the data is read from the protected cache at operation 408. The UEFI may further perform any additional operations, as appropriate, before returning control to the OS at operation 412.

If a power loss has occurred, and if the PLI capacitor has a sufficient charge, determined at operation 420, then a "clean" shutdown is performed. at operation 424. The clean shutdown includes flushing or copying system variables from the protected cache to a non-volatile memory, at operation 424. The clean shutdown may further include the generation of a NMI, at operation 426, to cause the OS to perform any other operations that may be appropriate prior to the shutdown. If the PLI capacitor does not have sufficient charge, then a "dirty" shutdown will occur at operation 422. A dirty shutdown may thus result in the loss any data stored in the protected cache in volatile memory.

Figure 5:
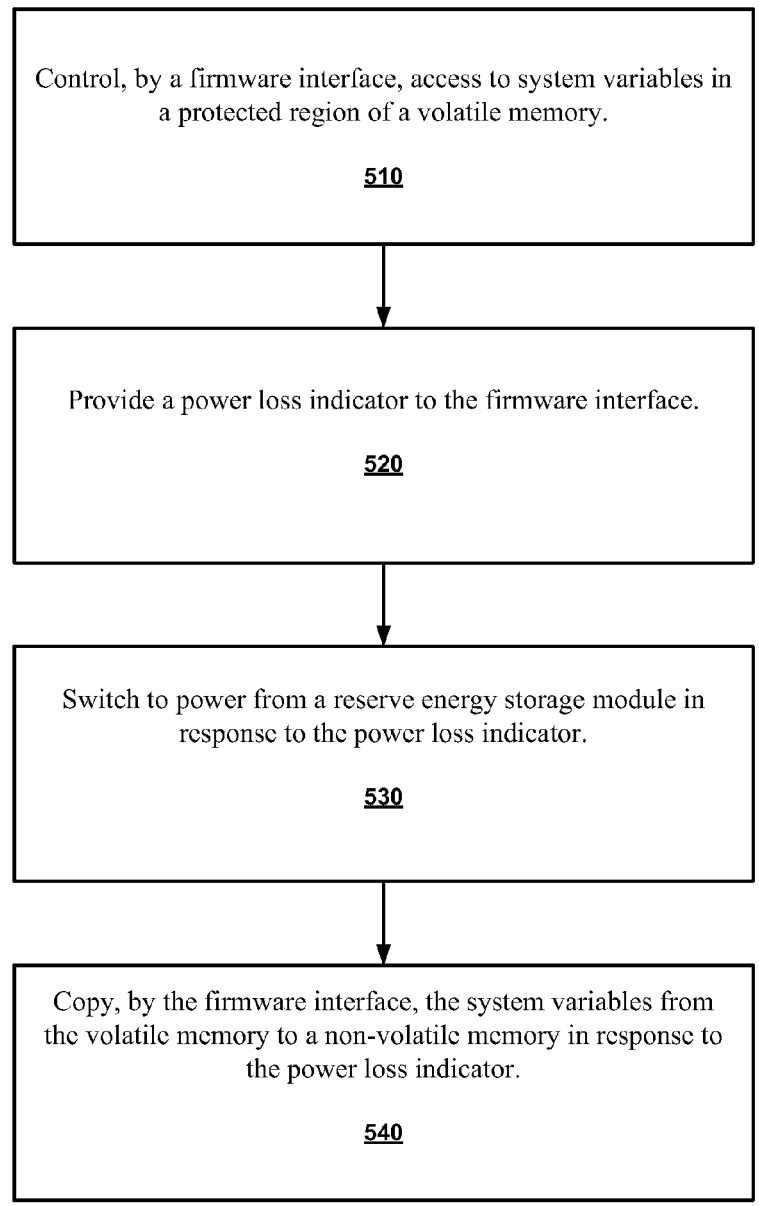
FIG. 5 illustrates a flowchart of operations of another example embodiment consistent with the present disclosure.

FIG. 5 illustrates a flowchart of operations 500 of another example embodiment consistent with the present disclosure. The operations generally provide a method for durable storage by a firmware interface. At operation 510, a firmware interface controls access to system variables in a protected region of a volatile memory. At operation 520, a power loss indicator is provided to the firmware interface. At operation 530, a switch to power from a reserve energy storage module is performed in response to the power loss indicator. At operation 540, the system variables are copied, by the firmware interface, from the volatile memory to a non-volatile memory in response to the power loss indicator.

Figure 6:
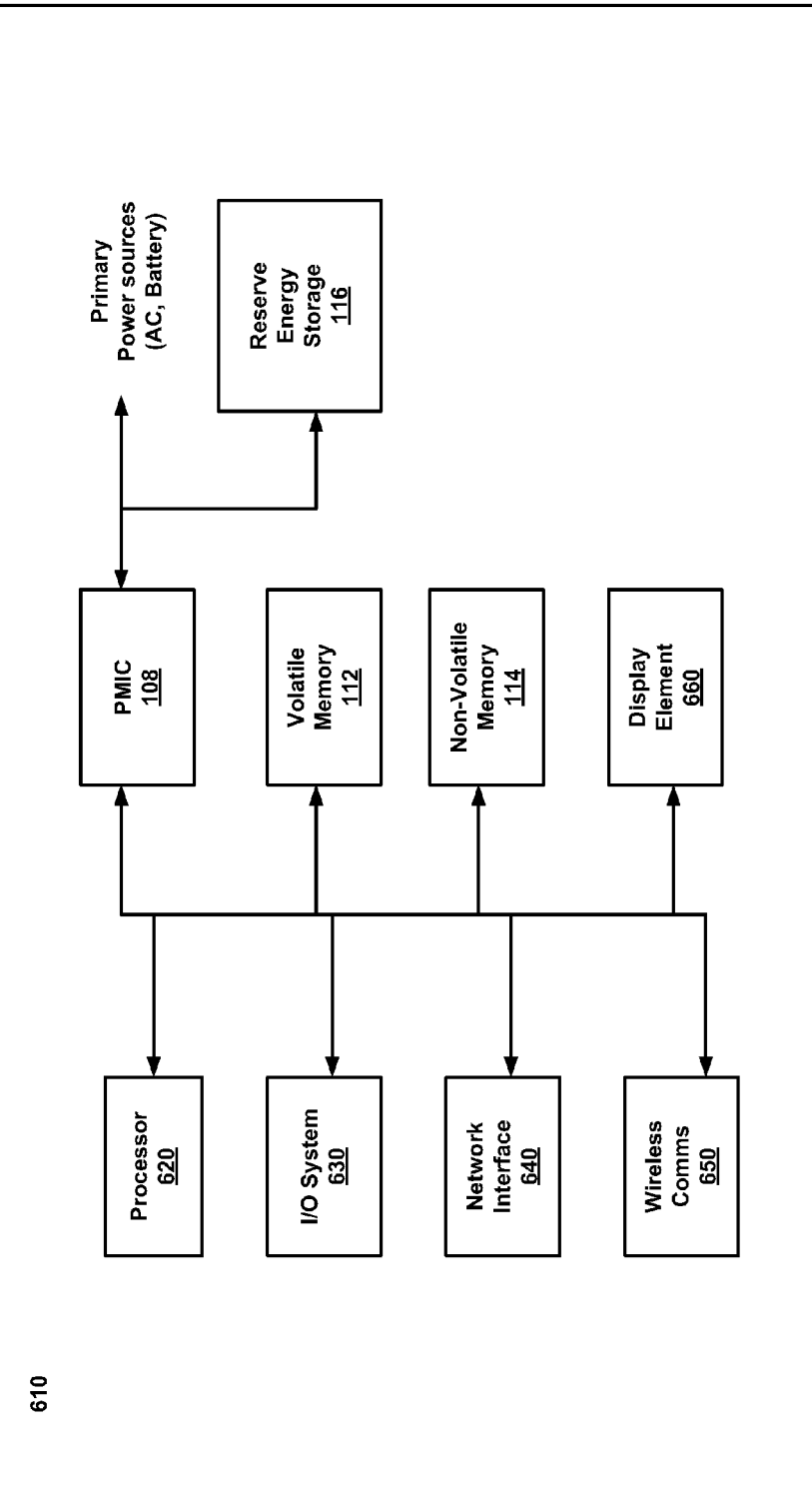
FIG. 6 illustrates a system diagram of a platform of another example embodiment consistent with the present disclosure.

FIG. 6 illustrates a system diagram 600 of one example embodiment consistent with the present disclosure. The system 600 may be a mobile platform 610 or computing device such as, for example, a smart phone, smart tablet, personal digital assistant (PDA), mobile Internet device (MID), convertible tablet, notebook or laptop computer, or any other suitable device. It will be appreciated, however, that embodiments of the system described herein are not limited to mobile platforms, and in some embodiments, the system 600 may be a workstation or desktop computer.

The system 600 is shown to include a processor 620. In some embodiments, processor 620 may be implemented as any number of processor cores. The processor (or processor cores) may be any type of processor, such as, for example, a micro-processor, an embedded processor, a digital signal processor (DSP), a network processor, a field programmable gate array or other device configured to execute code. Processor 620 may be a single-threaded core or, a multi-threaded core in that it may include more than one hardware thread context (or "logical processor") per core. System 600 is also shown to include memory coupled to the processor 620. The memory may include volatile memory 112 and non-volatile memory 114. The memory may be any of a wide variety of memories (including various layers of memory hierarchy and/or memory caches) as are known or otherwise available to those of skill in the art. It will be appreciated that processor 620 and memory 112, 114 may be configured to store, host and/or execute one or more operating systems, firmware interfaces, user applications or other software modules. These applications may include, but not be limited to, for example, any type of computation, communication, data management, data storage and/or user interface task. In some embodiments, these applications may employ or interact with any other components of the mobile platform 610.

System 600 is also shown to include network interface module 640 which may be configured to provide, for example, Ethernet connectivity to the platform. System 600 is also shown to include wireless communications module 650 which may include wireless communication capabilities, such as, for example, cellular communications, Wireless Fidelity (WiFi), Bluetooth®, and/or Near Field Communication (NFC). The wireless communications may conform to or otherwise be compatible with any existing or yet to be developed communication standards including past, current and future version of Bluetooth®, Wi-Fi and mobile phone communication standards.

System 600 is also shown to include an input/output (IO) system or controller 630 which may be configured to enable or manage data communication between processor 620 and other elements of system 600 or other elements (not shown) external to system 600.

The system may generally present various interfaces to a user via a display element 660 such as, for example, a touch screen, liquid crystal display (LCD) or any other suitable display type.

System 600 is also shown to include PMIC module 108 and reserve energy storage module 116, the operations of which have been described in detail above.

It will be appreciated that in some embodiments, the various components of the system 600 may be combined in a system-on-a-chip (SoC) architecture. In some embodiments, the components may be hardware components, firmware components, software components or any suitable combination of hardware, firmware or software.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as, for example, processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may include, for example, singly or in any combination, hardwired circuitry, programmable circuitry, state machine circuitry, and/or firmware that stores instructions executed by programmable circuitry. An app may be embodied as code or instructions which may be executed on programmable circuitry such as a host processor or other programmable circuitry. A module, as used in any embodiment herein, may be embodied as circuitry. The circuitry may be embodied as an integrated circuit, such as an integrated circuit chip.

Thus, the present disclosure provides systems, devices, methods and computer readable media for a UEFI with durable storage to provide memory write persistence, for example, in the event of power loss. The following examples pertain to further embodiments.

According to example 1 there is provided a system to provide durable storage for a firmware interface. The system may include a processor to host the firmware interface, the firmware interface to control access to system variables in a protected region of a volatile memory. The system of this example may also include a power management circuit to provide power to the processor and further to provide a power loss indicator to the firmware interface. The system of this example may further include a reserve energy storage module to provide power to the processor in response to the power loss indicator. The firmware interface of this example may be configured to copy the system variables from the volatile memory to a non-volatile memory in response to the power loss indicator.

Example 2 may include the elements of the foregoing example, and the reserve energy storage module is a capacitor.

Example 3 may include the elements of the foregoing example, and the processor is further to host an operating system (OS), the firmware interface to control access by the OS to the system variables.

Example 4 may include the elements of the foregoing example, and further includes a second processor to host an operating system (OS), the firmware interface to control access by the OS to the system variables.

Example 5 may include the elements of the foregoing example, and the power loss indicator is associated with a System Management Interrupt (SMI) of the firmware interface.

Example 6 may include the elements of the foregoing example, and the firmware interface is further to generate a Non-Maskable Interrupt (NMI) to the OS after copying the system variables to the non-volatile memory.

Example 7 may include the elements of the foregoing example, and the power management circuit is further to charge the reserve energy storage module.

Example 8 may include the elements of the foregoing example, and the firmware interface is a Unified Extensible Firmware Interface (UEFI).

Example 9 may include the elements of the foregoing example, and the reserve energy storage module is a battery.

Example 10 may include the elements of the foregoing example, and the volatile memory is Dynamic Random Access Memory (DRAM).

Example 11 may include the elements of the foregoing example, and the non-volatile memory is Flash memory.

Example 12 may include the elements of the foregoing example, and the system is a smart phone, smart tablet, notebook or laptop computer.

According to example 13 there is provided a method for providing durable storage by a firmware interface. The method may include controlling, by the firmware interface, access to system variables in a protected region of a volatile memory. The method of this example may also include providing a power loss indicator to the firmware interface. The method of this example may further include switching to power from a reserve energy storage module in response to the power loss indicator. The method of this example may further include copying, by the firmware interface, the system variables from the volatile memory to a non-volatile memory in response to the power loss indicator.

Example 14 may include the operations of the foregoing example, and the reserve energy storage module is a capacitor.

Example 15 may include the operations of the foregoing example, and the system variables are controllably accessed by an operating system (OS).

Example 16 may include the operations of the foregoing example, and further includes generating a System Management Interrupt (SMI) of the firmware interface, the SMI associated with the power loss indicator.

Example 17 may include the operations of the foregoing example, and further includes generating a Non-Maskable Interrupt (NMI) to the OS after copying the system variables to the non-volatile memory.

Example 18 may include the operations of the foregoing example, and further includes charging the reserve energy storage module.

Example 19 may include the operations of the foregoing example, and the firmware interface is a Unified Extensible Firmware Interface (UEFI).

According to example 20 there is provided a system for providing durable storage by a firmware interface. The system may include means for controlling, by the firmware interface, access to system variables in a protected region of a volatile memory. The system of this example may also include means for providing a power loss indicator to the firmware interface. The system of this example may further include means for switching to power from a reserve energy storage module in response to the power loss indicator. The system of this example may further include means for copying, by the firmware interface, the system variables from the volatile memory to a non-volatile memory in response to the power loss indicator.

Example 21 may include the elements of the foregoing example, and the reserve energy storage module is a capacitor.

Example 22 may include the elements of the foregoing example, and the system variables are controllably accessed by an operating system (OS).

Example 23 may include the elements of the foregoing example, and further includes means for generating a System Management Interrupt (SMI) of the firmware interface, the SMI associated with the power loss indicator.

Example 24 may include the elements of the foregoing example, and further includes means for generating a Non-Maskable Interrupt (NMI) to the OS after copying the system variables to the non-volatile memory.

Example 25 may include the elements of the foregoing example, and further includes means for charging the reserve energy storage module.

Example 26 may include the elements of the foregoing example, and the firmware interface is a Unified Extensible Firmware Interface (UEFI).

According to another example there is provided at least one computer-readable storage medium having instructions stored thereon which when executed by a processor, cause the processor to perform the operations of the method as described in any of the examples above.

According to another example there is provided an apparatus including means to perform a method as described in any of the examples above.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A system to provide durable storage for a firmware interface, said system comprising:
   a processor to host said firmware interface, said firmware interface to control access to system variables in a protected region of a volatile memory;
   a power management circuit to provide power to said processor and further to provide a power loss indicator to said firmware interface;
   a reserve energy storage module to provide power to said processor in response to said power loss indicator; and
   said firmware interface is further to copy said system variables from said volatile memory to a non-volatile memory in response to said power loss indicator.

2. The system of claim 1, wherein said reserve energy storage module is a capacitor.

3. The system of claim 1, wherein said processor is further to host an operating system (OS), said firmware interface to control access by said OS to said system variables.

4. The system of claim 1, further comprising a second processor to host an operating system (OS), said firmware interface to control access by said OS to said system variables.

5. The system of claim 1, wherein said power loss indicator is associated with a System Management Interrupt (SMI) of said firmware interface.

6. The system of claim 3, wherein said firmware interface is further to generate a Non-Maskable Interrupt (NMI) to said OS after copying said system variables to said non-volatile memory.

7. The system of claim 1, wherein said power management circuit is further to charge said reserve energy storage module.

8. The system of claim 1, wherein the firmware interface is a Unified Extensible Firmware Interface (UEFI).

9. The system of claim 1, wherein said reserve energy storage module is a battery.

10. The system of claim 1, wherein said volatile memory is Dynamic Random Access Memory (DRAM).

11. The system of claim 1, wherein said non-volatile memory is Flash memory.

12. The system of claim 1, wherein said system is a smart phone, smart tablet, notebook or laptop computer.

13. A method for providing durable storage by a firmware interface, said method comprising:
controlling, by said firmware interface hosted by a processor, access to system variables in a protected region of a volatile memory;
providing, by a power management circuit, a power loss indicator to said firmware interface;
switching to power supplied by a reserve energy storage module in response to said power loss indicator;
maintaining, by said power management circuit, a power supply from said reserve energy storage module to said processor hosting said firmware interface; and
copying, by said firmware interface, said system variables from said volatile memory to a non-volatile memory in response to said power loss indicator.

14. The method of claim 13, wherein said reserve energy storage module is a capacitor.

15. The method of claim 13, wherein said system variables are controllably accessed by an operating system (OS).

16. The method of claim 13, further comprising generating a System Management Interrupt (SMI) of said firmware interface, said SMI associated with said power loss indicator.

17. The method of claim 15, further comprising generating a Non-Maskable Interrupt (NMI) to said OS after copying said system variables to said non-volatile memory.

18. The method of claim 13, further comprising charging said reserve energy storage module.

19. The method of claim 13, wherein the firmware interface is a Unified Extensible Firmware Interface (UEFI).

20. A non-transitory computer-readable storage medium having instructions stored thereon which when executed by a processor result in the following operations for providing durable storage by a firmware interface, said operations comprising:
controlling, by said firmware interface hosted by the processor, access to system variables in a protected region of a volatile memory;
providing, by a power management circuit, a power loss indicator to said firmware interface;
switching to power supplied by a reserve energy storage module in response to said power loss indicator;
maintaining, by said power management circuit, a power supply from said reserve energy storage module to said processor hosting said firmware interface; and
copying, by said firmware interface, said system variables from said volatile memory to a non-volatile memory in response to said power loss indicator.

21. The non-transitory computer-readable storage medium of claim 20, wherein said reserve energy storage module is a capacitor.

22. The non-transitory computer-readable storage medium of claim 20, wherein said system variables are controllably accessed by an operating system (OS).

23. The non-transitory computer-readable storage medium of claim 20, further comprising the operation of generating a System Management Interrupt (SMI) of said firmware interface, said SMI associated with said power loss indicator.

24. The non-transitory computer-readable storage medium of claim 22, further comprising the operation of generating a Non-Maskable Interrupt (NMI) to said OS after copying said system variables to said non-volatile memory.

25. The non-transitory computer-readable storage medium of claim 20, further comprising the operation of charging said reserve energy storage module.

26. The non-transitory computer-readable storage medium of claim 20, wherein the firmware interface is a Unified Extensible Firmware Interface (UEFI).

* * * * *